United States Patent [19]
Gröger

[11] Patent Number: 6,067,216
[45] Date of Patent: May 23, 2000

[54] SAFEGUARD FEATURE IN A CIRCUIT ARRANGEMENT FOR PROTECTING AN ELECTRICAL COMPONENT FROM AN UNDESIRABLE ELECTRICAL POTENTIAL

[75] Inventor: Jens Gröger, Hannover, Germany

[73] Assignee: WABCO GmbH, Hannover, Germany

[21] Appl. No.: 09/197,900

[22] Filed: Nov. 23, 1998

[30] Foreign Application Priority Data

Nov. 28, 1997 [DE] Germany .......................... 197 52 781

[51] Int. Cl.$^7$ .................................................. H02H 9/00
[52] U.S. Cl. ........................... 361/56; 361/103; 361/111; 361/115; 361/124
[58] Field of Search .................................. 361/124, 120, 361/118, 115, 113, 111, 91.1, 58, 56, 103, 105

[56] References Cited

U.S. PATENT DOCUMENTS 4,862,134  8/1989  Poerschke et al. ...................... 337/231

*Primary Examiner*—Stephen W. Jackson
*Attorney, Agent, or Firm*—Proskauer Rose LLP

[57] ABSTRACT

A safeguard feature prevents supply of voltage to an electrical device in the event a protective element is no longer reliably connected in a circuit arrangement for protecting a susceptible component from inadmissible voltage values. The protective element in the circuit arrangement is often conveniently provided in the form of a suppressor diode, which is connected in parallel with the susceptible component to be protected, and which experiences breakdown in case of excessive voltage, thereby causing a short-circuit in the power supply. In the event of such protective response, the suppressor diode may heat up considerably, and that the solder used for electrical and mechanical attachment may liquefy or evaporate. As a result the suppressor diode may become completely or partially unsoldered, so that a reliable protection of the susceptible component is no longer ensured by the shorting of the circuit thereacross. At least one of the conductors going from the power supply system to the protected component is therefore provided with a break location, and one of the connections of the suppressor diode bridges the break location prior to breakdown. If the suppressor diode then becomes unsoldered or otherwise detached from the rest of the protection circuit, the susceptible component is nevertheless protected from the inadmissible voltage since it is isolated therefrom by the discontinuity in the conductor provided by a separation therebetween defined by the break location.

14 Claims, 2 Drawing Sheets

SAFEGUARD FEATURE IN A CIRCUIT ARRANGEMENT FOR PROTECTING AN ELECTRICAL COMPONENT FROM AN UNDESIRABLE ELECTRICAL POTENTIAL

BACKGROUND OF THE INVENTION

The present invention relates to a circuit arrangement for protecting an electrical component from undesirably high values of electrical potential, and more particularly a safeguard feature in such a circuit arrangement which prevents continued supply of voltage to the electrical component in the absence of the proper protective function of the circuit arrangement.

Circuit arrangements of this type are generally employed when an electrical device is operated by a power supply in which an unacceptably high output voltage may occasionally occur. A common application for such arrangement, for example, is in conjunction with a typical power supply present in a motor vehicle comprising a three phase generator with a regulator and battery. In such systems, voltage peaks produced by the three phase generator are not reliably suppressed by the regulator or the battery in all instances. Consequently, under certain conditions, undesirable voltage peaks output from the power supply may reach the sensitive electrical devices supplied thereby. In such cases, the electrical devices may be damaged by the surge in voltage in the absence of further protective measures.

A known circuit arrangement for protecting an electrical device from excessively high voltage peaks, and which is often incorporated in the device itself, is connected in parallel with the component to be protected, and is located between the source of the electrical potential, i.e. generally the power supply, and the component. Specialized circuit elements, referred to as suppressor diodes and having the unique characteristic of selectively conducting when exposed to a threshold voltage potential level above normal operating voltage, are frequently used as protective elements in such circuit arrangements. When a voltage in excess of the threshold triggering value of the suppressor diode is reached, i.e. the result of an unacceptably high voltage peak, a connection is established across the terminals thereof Voltage is thereby short-circuited within the protective circuit portion of the electrical device, and does not therefore reach the component to be protected. A fuse is also provided in or before the electrical device which opens to avoid damage resulting from the resultant short-circuit.

Protective response of the known circuit arrangement to an inadmissible voltage peak is accompanied by a simultaneous intense warming of the protective element. Since the protective element is generally mounted on a electrical printed circuit and conductively connected to same by means of soldered connections, heat generated by the protective element during a shorting thereof is transferred to the solder. As the temperature of the solder is increased beyond the melting point, the soldered connections are liquified, and may flow off. In some cases the heat generated by the protective element is intense enough to cause the solder holding it in place to evaporate. In either event, mechanical attachment, and thereby secure electrical connection of the protective element in the circuit, is no longer insured.

Even when the solder does not flow off or evaporate, a secure connection of the protective element is not always insured once the solder has liquefied. For example, in applications in which mechanical vibrations act upon the protective element or the electrical device, the danger exists that the protective element may be dislodged from the printed circuit before the protective effect occurs or before the fuse is destroyed, insofar as the protective element is mechanically attached exclusively by the soldered connection.

The above-mentioned danger can be reduced by mechanical attachment of the protective element by means supplemental to soldering, for example by use of adhesive or by bending of the element leads. The latter measure would not however be a feasible option in connection with surface-mounted devices (SMD). It is yet another disadvantage of such attachment methods that additional effort, and thereby increased costs, occur in the manufacture of the electrical device as a result thereof.

It is therefore an object of the invention to provide a circuit arrangement for protecting an electrical component from undesirable values of electrical potential, in which reliable protection of the electrical element from such voltage surges is made possible in a simple manner, using conventional protection elements.

SUMMARY OF THE INVENTION

In accordance with these and other objects of the invention, there is provided a circuit arrangement for protection of an electrical component from undesirable values of an electrical potential. The arrangement includes a conductor for connecting the electrical component to the electrical potential, and a protective element including a connection portion for electrically connecting the protective element to the conductor. A break location is formed along the conductor defined by separated parts of the conductor thereby creating a discontinuity between the electrical component and a source of the electrical potential. The connection portion of the protective element includes means for conductively bridging the separated parts of the conductor when the connection portion is connected to the conductor at the break location. If the protective element then becomes unsoldered or otherwise detached from the rest of the protection circuit, the susceptible electrical component is nevertheless protected from the inadmissible voltage since it is isolated therefrom by the discontinuity in the conductor provided by a separation therebetween defined by the break location.

An advantage of the present invention is that it can be utilized in any electrical device subject to power supply voltage surges, without requiring additional manufacturing expenditure. When producing the support on which the protective element is to be mounted, practice of the invention merely requires formation of a break at the circuit location provided therealong corresponding to a conductor transmitting the electrical potential to the electrical component, and to which conductor the protective element is normally connected. Particularly when an electric printed circuit is used as the support of the protective element, and possibly also for the electrical component to be protected, no additional expenditure in the manufacture of the printed circuit is required in providing an embodiment of the safeguard feature in accordance with the invention. No additional means for mechanical attachment of the protective element, such as for example a holding metal sheet or adhesive, both of which would necessary have to be temperature resistant, are necessary.

In the event of an inadmissable voltage peak in which a protective effect is implemented by the protective circuit arrangement, the invention reliably protects the component to be protected from the inadmissible value of electrical potential even without the protective action of the protective element because the component to be protected is then no longer connected to this potential. The fact that the solder flows off or evaporates, or that the protective elements falls out, causes a separation of the break location according to the invention which is bridged by a connection of the protective element before the protective effect occurs, so that the component to be protected is reliably protected from the inadmissible value of the electrical potential even without the protective short circuiting action of the protective element because the component to be protected is then isolated from the voltage potential. The invention thereby covers all described contingencies which may occur as a consequence of the protective action.

In an advantageous further embodiment of the invention, the protective element is in the form of a surface-mounted component (SMD) designed for attachment on an electric printed circuit, thereby making the protective element an inexpensive component.

In another advantageous embodiment of the invention, a special connection point is provided on the location of the conductor on which the connection of the protective element connects the parts of the conductor separated from each other by the break location. The configuration of the special connection point corresponds to the type of the protective element in such manner that the protective element is provided with a reliable mechanical and electrical connection to the parts of the conductor. Especially when using surface-mounted components as protective elements, the connection location is advantageously provided in the form of a soldering pad. This takes the form of a relatively wide conductor path segment as compared with the width of the other conductors, which is adapted in its form to the component to be mounted on it. Soldering pads are usually rectangular in shape.

Since suitable protective elements include, for example, a diode, a varistor or a thyristor, which are regularly provided with at least one additional connection portion, in order to insure the above-described proper function of the invention, it is important that just that connection portion of the protective element corresponding with the break location be disconnected. Generally this is ensured when using conventional protective elements, simply by the fact that they have a non-symmetrical housing, causing an uneven distribution of temperature within the housing and thereby also in the connection portions of the protective element. For this reason, the connection of the protective element at which the highest temperature occurs as a result of the expected temperature distribution when the protective action occurs is preferably used to bridge the break location.

In an advantageous further embodiment of the invention, an additional connection location is provided for the at least one additional connection portion of the protective element, and this connection location has a greater surface than the parts of the divided connection location together. In this way the desired temperature distribution described above can also be influenced in the desired manner with protective elements having comparatively symmetrically housings, i.e. by improving the heat diversion of the additional connection location where there is no break location.

In another advantageous further embodiment, the additional connection location or locations each include a break location. This provides the advantage that thermodynamic effects need not be taken into consideration when designing the electrical device.

In an advantageous further embodiment of the invention, a protective element is selected which characteristically changes its external geometrical form when the protective effect occurs. As a result, the connection portion of the protective element which bridges the break location moves away mechanically from the break location when the protective effect occurs, so that the parts of the conductor are no longer connected to each other. The protective element preferably assumes a convex form adapted to the printed circuit on which it is installed, so that the connection which previously bridged the break location then lifts off and stands out from the printed circuit.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
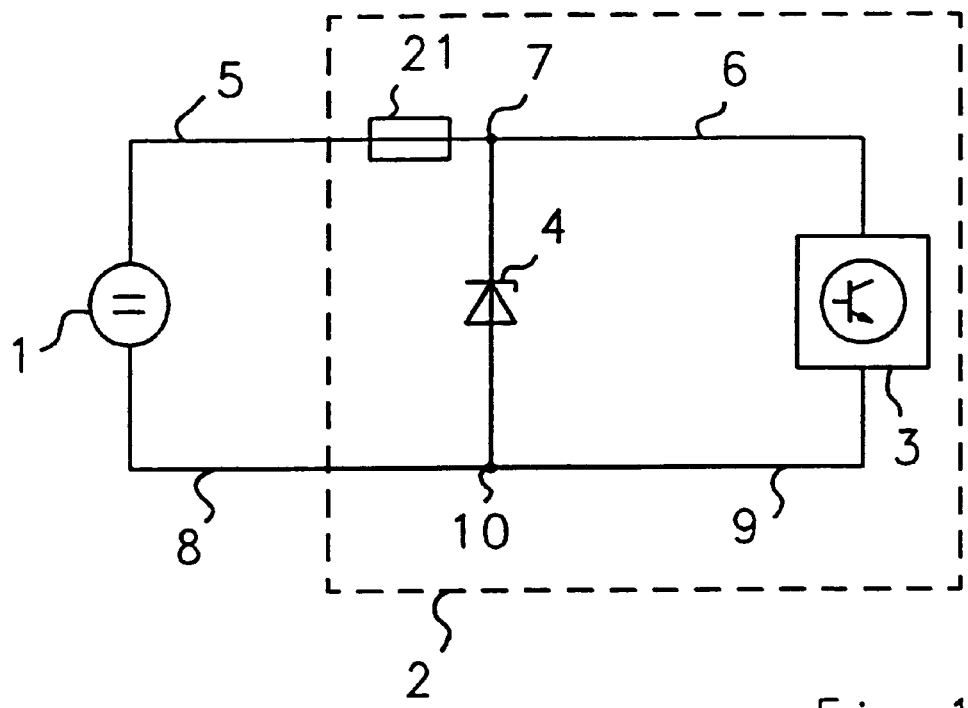
FIG. 1 is a electrical schematic diagram of the circuit arrangement according to the invention.

Referring now to the figures, and in particular FIG. 1, the operational principle of a circuit arrangement for the protection of electrical components from inadmissible electrical voltages is described with reference thereto. The representation of FIG. 1 applies generally to known circuit arrangements, as well as to the circuit arrangement according to the invention.

A symbolically represented device 1, functioning as a power supply, supplies an electrical potential via electric conductors 5, 8 to an electric device 2. Device 1 may be, for example, a power supply in a motor vehicle, comprising a 3-phase current generator, a transistor regulator and a battery (not shown), or may be an insufficiently stabilized mains supply circuit.

An electrical component 3 is installed in electric device 2, operation of which is at a line voltage which must be within a given, admissible range. In case of a line voltage outside this range, electrical component 3 may be damaged. Depending on the application, electrical component 3 may be a single electric or electronic component, such as for example a light emitting diode, or may alternatively be a circuit arrangement itself comprising a plurality of electric or electronic components, for example including a microprocessor and a memory module. Electrical component 3 is supplied via electric conductors 6, 8 with the potential difference transmitted to the electric device 2 in form of a conductor voltage.

A protective element 4 is connected in parallel with electrical component 3. Protective element 4 in the example depicted in FIG. 1 is provided in the form of a suppressor diode which has the characteristic that when an electrical voltage exceeding a given value is applied, it establishes a connection between its two terminals, a phenomenon referred to as "breakdown". Because of this unique mode of operation, diode 4 requires parallel placement relative to electrical component 3 in order to effectively provide protection to electrical component 3. Protective element 4 is therefore connected at a connection point 7 to conductors 5, 6, and at a connection point 10 to conductors 8, 9.

Conductor 5 is furthermore equipped with a fuse 21, which may be located within electric device 2 as shown in FIG. 1, or alternatively outside same.

If as a result of a malfunction of the device for power supply 1 inadmissible electrical potentials, for example an inadmissibly high or low potential difference, reaches electric device 2 via electric conductors 5, 8, diode 4 would breakdown and thus provoke a short-circuit between connection points 7, 10. Therefore, the inadmissible potential difference is prevented from reaching electrical component 3 via electric conductors 6, 9. In addition, fuse 21 is opened shortly thereafter, cutting off any further flow of current caused by the short circuit. Electrical component 3 is thereby protected from damage.

Figure 2:
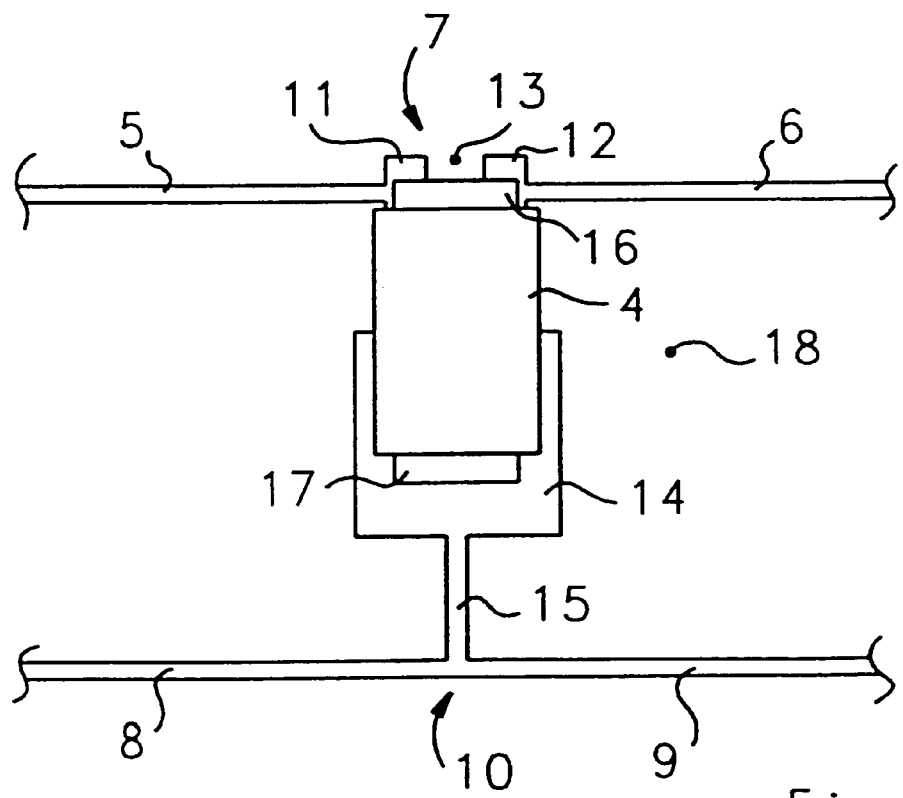
FIG. 2 is a plan view of a protective element and the portion of an electric printed circuit employing an embodiment in accordance with the invention.
Figure 3:
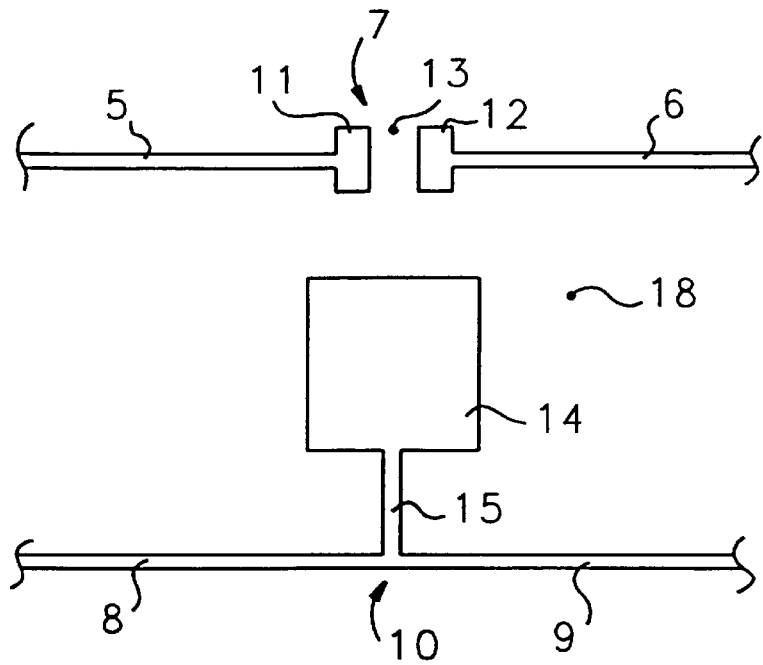
FIG. 3 is a plan view of the embodiment of FIG. 2 without the protective element mounted.

FIGS. 2 and 3 show details of the circuit arrangement shown in FIG. 1 with electrical circuit symbols. Parts 1, 3, 21 of FIG. I are omitted therefrom. Furthermore, diode 4 is not shown in FIG. 3.

Conductors 5, 6, 8, 9 are shown in detail in FIGS. 2 and 3, provided in the form of electrical printed conductors which, for clarity of disclosure, are provided with the same reference numbers as FIG. 1.

FIG. 2 depicts, in plan view, an electric printed circuit 18 on which electrical printed conductors 5, 6, 8, 9, 15, a pair of first soldering pads 11, 12 and a second soldering pad 14. Soldering pads 11, 12, 14 are partially covered by diode 4 which is placed over them. Diode 4 is provided with connection portions 16, 17 which are electrically and mechanically connected to the soldering pads 11, 12, 14, by means of a conductive solder, preferably conductor tin. The pair of first soldering pads 11, 12 are electrically connected with printed conductors 5, 6. Second soldering pad 14 is connected via a printed conductor 15 to printed conductors 8, 9.

A break location 13 is provided between the pair of first soldering pads 11, 12 which divides the pair of first soldering pads into two individual, electrically separate parts 11 and 12. Individual part 11 is connected to printed conductor 5 leading to power supply device 1. Part 12 is connected to printed conductor 6 leading to electrical component 3. Prior to the occurrence of the protective action, i.e. before the breakdown of diode 4, connection portion 16 of diode 4 bridges break location 13 so that the parts 11 and 12 of the pair of first soldering pads 11, 12 are connected electrically by means of the solder.

When the protective action occurs in response to a inadmissible voltage surge, i.e. when diode 4 experiences breakdown and becomes shorted as a result of an excessively high electrical voltage, the solder liquefies as a result of heating of diode 4. The intensity of the heat may be severe enough to cause the solder to evaporate. Also, electric device 2 may be mechanically jarred during breakdown, and, depending on the intensity and duration of the heating, cause detachment of diode 4 from the electric printed circuit 18, as shown in FIG. 3. In any of the aforementioned events, the previously desired bridging of break location 13 by the structure of connection portion 16 is no longer reliably ensured, which cuts the supply of voltage to electric device 2, and thereby provides back-up protection of electrical component 3 from inadmissible voltage values even though the reliable functioning of diode 4 in providing a short circuit path across the power supply device 1 may be concomitantly jeopardized by electrical disconnection of diode 4 from the circuit, as previously noted.

FIG. 3 shows the arrangement without diode 4, i.e. either before the soldering of diode 4 during the manufacture of electric device 2 or after unsoldering as a result of heat generation.

Break location 13 serves as a dividing line between parts 11 and 12 of the pair of first soldering pads 11, 12. This dividing line is preferably perpendicular, or nearly perpendicular, to the directly adjoining printed conductors 5, 6. In this manner, commercially available suppressor diodes can be used in SMD construction, as shown in FIGS. 2 and 4.

Second soldering pad 14 advantageously has a greater surface area than the combined area of parts 11 and 12 of the pair of first soldering pads 11, 12. Therefore, when symmetrically constructed protective elements are used, a correspondingly asymmetrical temperature distribution is ensured, in such manner that the heat removal on the non-divided second soldering pad 14 is improved over that of the divided pair of first soldering pads 11, 12. For this reason, heating of protective element 4 on the divided pair of first soldering pads 11, 12 results in a more rapid temperature rise than on the undivided second soldering pad 14, so that the solder liquefies there first.

Figure 4:
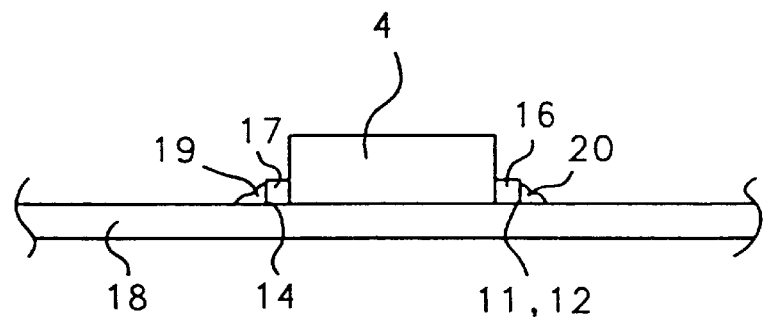
FIG. 4 is an elevational view of the representation of FIG. 2 prior to an occurrence of the protective action.
Figure 5:
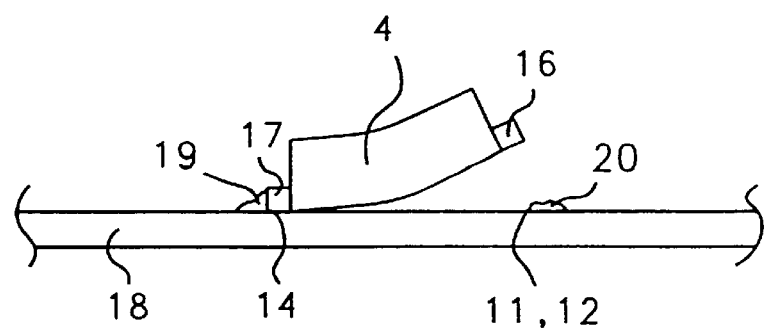
FIG. 5 is an elevational view of the arrangement of FIG. 4 following the occurrence of the protective action.

FIGS. 4 and 5 shows a detailed lateral view of electric device 2 represented in FIG. 2.

In FIG. 4, protective action has not yet occurred. Diode 4 is connected electrically and mechanically via electrical connection portions 16, 17 and by a connecting structure, namely, solder 19, 20 to the above described soldering pads 11, 12, 14 located on electric printed circuit 18. In the embodiment shown here, a diode 4 is used which is characteristically mechanically deformed at the occurrence of the protective action, i.e. when heated.

FIG. 5 depicts diode 4 of FIG. 4 following mechanical deformation thereof. Diode 4 arches away from electric printed circuit 18 when the protective effect takes place, a connection portion of diode 4 lifting off printed circuit 18 corresponding to a side of diode 4 at which the solder first liquefies. In the depicted example this is connection portion 16. Such behavior of diode 4 can be ensured as desired in a targeted manner by means of a multi-layer structure of diode 4, in which diode 4 is comprised of at least two layers of materials with different thermal expansion coefficients.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit arrangement for protection of an electrical component from undesirable values of an electrical potential, comprising:
   a conductor for connecting the electrical component to the electrical potential;
   a protective element including a connection portion for electrically connecting the protective element to the conductor;
   a break location formed along the conductor defined by separated parts of the conductor which create a discontinuity between the electrical component and a source of the electrical potential; and the connection portion of the protective element including means for conductively bridging the separated parts of the conductor when the connection portion is connected to the conductor at the break location;

wherein the protective element alters its geometric form in response to actuation of its protective function.

2. A circuit arrangement according to claim 1, wherein the protective element includes means for permitting surface mounting thereof on a surface of a printed circuit.

3. A circuit arrangement according to claim 1, further comprising:

a connection area formed on the conductor including a soldering pad for connection of the protective element to the conductor; and the connection area containing the break location in such manner that it is divided into at least two parts which are electrically separated from each other, respective ones of the at least two parts of the connection area being electrically connected to corresponding separated portions of the electrical conductor.

4. A circuit arrangement according to claim 3, further comprising:

an additional connection area formed along another conductor;

the protective element including an additional connection portion for connection therewith to the additional connection area; and the additional conduction area having a greater surface area than a combined area of the at least two parts of the connection area.

5. A circuit arrangement according to claim 3, wherein the connection area includes a dividing line which is approximately perpendicular to adjoining separated portions of the conductor.

6. A circuit arrangement according to claim 3, wherein the at least two parts of the connection area are separated at a distance of at least 0.7 mm from each other.

7. A circuit arrangement according to claim 1, wherein the protective element is a diode, a varistor or a thyristor.

8. A circuit arrangement according to claim 1, wherein the protective element is connected in parallel with the electrical component to be protected.

9. A circuit arrangement according to claim 1, wherein the means for conductively bridging the separated parts of conductor includes at least two terminal legs mounted separately from each other and electrically connected to one another.

10. A circuit arrangement according to claim 4, wherein the additional connection area includes at least two parts which are electrically separate from each other.

11. A circuit arrangement according to claim 1, wherein the protective element is comprised of at least two layers of materials having different thermal expansion coefficients from one another.

12. A circuit arrangement according to claim 1, further comprising:

a connecting structure which connects the connection portion of the protective element to the conductor at the divided connection area; and the connecting structure includes means for changing an aggregate state thereof when a protective function of the protective element is actuated.

13. A circuit arrangement according to claim 12, wherein the connecting structure comprises a solder.

14. A circuit arrangement according to claim 13, wherein the solder is a soldering tin.

* * * * *